(12) United States Patent
Aonuma et al.

(10) Patent No.: US 7,329,817 B2
(45) Date of Patent: Feb. 12, 2008

(54) PARTIALLY COMPLETED WIRING CIRCUIT BOARD ASSEMBLY SHEET AND PRODUCTION METHOD OF WIRING CIRCUIT BOARD USING SAID SHEET

(75) Inventors: Hidenori Aonuma, Ibaraki (JP); Tetsuya Ohsawa, Ibaraki (JP); Yasuhito Ohwaki, Ibaraki (JP)

(73) Assignee: Nitto Denko Corporation, Ibaraki-shi (JP)

(*) Notice: Subject to any disclaimer, the term of this patent is extended or adjusted under 35 U.S.C. 154(b) by 54 days.

(21) Appl. No.: 11/195,965

(22) Filed: Aug. 3, 2005

(65) Prior Publication Data

US 2006/0027393 A1  Feb. 9, 2006

(30) Foreign Application Priority Data

Aug. 5, 2004  (JP) .............................. 2004-229363

(51) Int. Cl.
H01R 12/04  (2006.01)
(52) U.S. Cl. ..................... 174/261; 174/255; 174/262
(58) Field of Classification Search ............... 428/209; 174/255, 261–262
See application file for complete search history.

(56) References Cited

U.S. PATENT DOCUMENTS

| | | | |
|---|---|---|---|
| 6,198,052 B1* | 3/2001 | Omote et al. ............... | 174/261 |
| 6,399,899 B1* | 6/2002 | Ohkawa et al. ............. | 174/261 |
| 6,717,059 B2* | 4/2004 | Shintani et al. ............. | 174/251 |
| 6,797,888 B2* | 9/2004 | Ookawa et al. ............. | 174/255 |
| 2001/0051707 A1 | 12/2001 | Fukuoka et al. | |
| 2003/0026078 A1 | 2/2003 | Komatsubara et al. | |
| 2003/0070931 A1 | 4/2003 | Kitchens | |

FOREIGN PATENT DOCUMENTS

| EP | 1 622 434 A1 | 2/2006 |
|---|---|---|
| JP | 2002-020898 A | 1/2002 |

* cited by examiner

*Primary Examiner*—Cathy F. Lam
(74) *Attorney, Agent, or Firm*—Leydig, Voit & Mayer, Ltd.

(57) ABSTRACT

The present invention provides a partially completed wiring circuit board assembly sheet capable of preventing deposition of a plating metal on the surface of a metal sheet, even when pinholes are produced in an insulating layer for insulating a lead wire for electroplating from a metal sheet.

The assembly sheet 100 of the present invention has a metal sheet 1, multiple wiring circuit board forming area 1A in compartments on the metal sheet and area 1B for forming a lead wire for electroplating, which is in compartment on the metal sheet 1. Each area 1A has a partially completed wiring circuit board 10. The partially completed wiring circuit board 10 is equipped with a base insulating layer 2, a wiring pattern 3 and a cover insulating layer 4. In the area 1B, a first insulating layer 12, a lead wire 13 for electroplating and a second insulating layer 14 are laminated in this order. Of the metal sheet 1, an opening 16 is formed in the part under the lead wire 13.

3 Claims, 8 Drawing Sheets

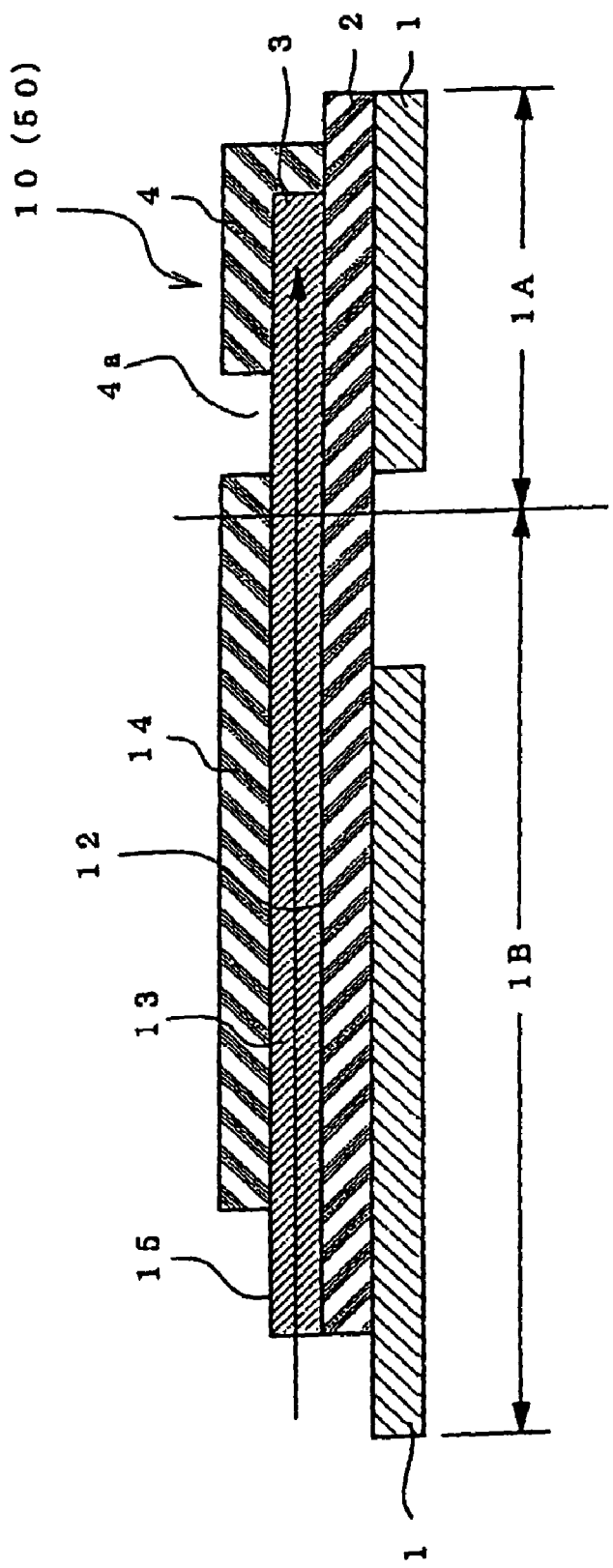

US 7,329,817 B2

PARTIALLY COMPLETED WIRING CIRCUIT BOARD ASSEMBLY SHEET AND PRODUCTION METHOD OF WIRING CIRCUIT BOARD USING SAID SHEET

TECHNICAL FIELD

The present invention relates to a partially completed wiring circuit board assembly sheet and a production method of wiring circuit board using said sheet.

BACKGROUND ART

In general, terminals connecting with an external device and the like are formed at predetermined portions of a wiring pattern in the final step of production of wiring circuit boards. For improved productivity of wiring circuit boards, plural wiring patterns are formed on a single metal sheet having a large area by a single process, and the patterns are divided to give respective wiring circuit boards. In many cases, terminals are formed on a wiring pattern on a wiring circuit board by an electroplating treatment. For this end, a multiplicity of partially completed wiring circuit boards are produced on a metal sheet. In the present specification, the "partially completed wiring circuit boards" means a semiproduct in a stage before forming a terminal. Furthermore, a partially completed wiring circuit board assembly sheet wherein lead wires for electroplating are formed on a wiring pattern of each partially completed wiring circuit board is used. The lead wire for electroplating is formed to electrically feed a wiring pattern during an electroplating treatment.

FIG. 5 is a sectional view of a conventional partially completed wiring circuit board assembly sheet, wherein a partially completed wiring circuit board 10 is formed on a wiring circuit board forming area 1A of a metal sheet 1. The partially completed wiring circuit board 10 comprises a base insulating layer 2, a wiring pattern 3 and a cover insulating layer 4 laminated in this order, and further comprises an opening 4a for forming a terminal in the cover insulating layer 4. In the metal sheet 1, an area 1B for forming a lead wire for electroplating comprises a first insulating layer 12 formed by the same process as for the base insulating layer 2, a lead wire 13 for electroplating formed by the same process as for the wiring pattern 3 and connected to the wiring pattern 3, and a second insulating layer 14 formed by the same process as for the cover insulating layer 4, which are laminated in this order. FIG. 5 shows a lamination structure of an area 1B for forming a lead wire for electroplating and an area containing one wiring circuit board forming area 1A adjacent thereto. In practice, the metal sheet 1 comprises multiple wiring circuit board forming areas 1A, each of which has a partially completed wiring circuit board 10. Lead wires for electroplating 13 are connected to the wiring pattern 3 of each partially completed wiring circuit board 10.

As shown in JP-A-2002-20898, for example, such partially completed wiring circuit board assembly sheet is generally subjected to an electroplating treatment using a plating apparatus. A plating apparatus is equipped with a plating solution housing part that contains a plating solution, a sheet conveyor means that transports a partially completed wiring circuit board assembly sheet while being immersed in the plating solution in the plating solution housing part, and a power feeding means that supply electricity upon contact with a power feeding part of a lead wire for electroplating in a partially completed wiring circuit board assembly sheet.

As shown in FIG. 6, a plating metal 5a is deposited on a wiring pattern 3 exposed from an opening 4a for forming a terminal in each of the multiple partially completed wiring circuit boards 10 to form a terminal (plated metal layer) 5, whereby a wiring circuit board 50 is completed.

In such a partially completed wiring circuit board assembly sheet, all conductive layers (wiring pattern 3, lead wire 13) on the metal sheet 1 are formed on an insulating layer (base insulating layer 2, first insulating layer 12) covering the surface of the metal sheet 1. In other words, these conductive layers are electrically insulated from the metal sheet 1. Therefore, when a power is fed via the lead wire 13 to the wiring pattern 3 to form a terminal 5 by an electroplating treatment, the metal sheet 1 is not electrified. As a result, in the wiring pattern 3, a plating metal 5a is deposited only on the part appearing from the opening 4a formed in a cover insulating layer 4.

SUMMARY OF THE INVENTION

As mentioned above, the first insulating layer 12 is formed on an area 1B for forming a lead wire for electroplating in the metal sheet 1 by a single process together with the base insulating layer 2. As shown in FIG. 7 (the same sectional view as FIG. 5), however, a pinhole 12a may be undesirably formed on the first insulating layer 12. In this event, the lead wire 13 and the metal sheet 1 are electrically connected and a plating metal 5a is precipitated on the surface of the metal sheet 1 beneath the lead wire 13. The unwanted consumption of the electroplating solution makes the plating metal to be deposited on the opening 4a on the partially completed wiring circuit board 10 insufficient, which in turn may result in a failure to reach the designed thickness of the terminal 5.

The present invention has been made in view of the above-mentioned situation, and aims at providing a partially completed wiring circuit board assembly sheet, wherein a pinhole in an insulating layer for insulating a lead wire for electroplating and a metal sheet does not easily cause precipitation of a plating metal on the surface of the metal sheet. Another object of the present invention is to suppress undesired consumption of a plating solution, prevent easy decrease in the thickness of a terminal (plated metal layer) formed on a partially completed wiring circuit board, and increase the production yield of a wiring circuit board, by the use of the above-mentioned partially completed wiring circuit board assembly sheet.

To solve the above-mentioned problems, the present inventors have completed the present invention encompassing the following.

(1) A partially completed wiring circuit board assembly sheet equipped with the following (A) to (C);
(A) a metal sheet,
(B) multiple wiring circuit board forming areas in compartments on the metal sheet,
each of which comprises a partially completed wiring circuit board comprising a base insulating layer, a wiring pattern and a cover insulating layer laminated in this order, and an opening for forming a terminal at a given part of the cover insulating layer, and
(C) an area for forming a lead wire for electroplating, which is in a compartment in the metal sheet,
which comprises a first insulating layer, a lead wire for electroplating and a second insulating layer laminated in this order, wherein
the first insulating layer is formed by the same process as for the base insulating layer, the lead wire for electroplating
is formed by the same process as for the wiring pattern,
is connected to the wiring pattern so as to provide a power to the wiring pattern, and
a part thereof is exposed to form a power feeding part,
the second insulating layer is formed by the same process as for the cover insulating layer, and
of the metal sheets, an opening is formed on the part beneath the lead wire for electroplating.
(2) The assembly sheet of the above-mentioned (1), wherein the lead wire for electroplating has multiple through holes.
(3) The assembly sheet of the above-mentioned (1) or (2), wherein the wiring circuit board is a suspension substrate with a circuit.
(4) A method of producing multiple wiring circuit boards at once, which comprises the steps of
immersing the assembly sheet of the above-mentioned (1) or (2) in a plating solution, and feeding a power to the wiring pattern in each partially completed wiring circuit board via the lead wire for electroplating in the aforementioned sheet, thereby forming an electroplated layer in the opening for forming a terminal in each partially completed wiring circuit board.

BRIEF DESCRIPTION OF THE DRAWINGS

FIG. 5 is a sectional view of a conventional partially completed wiring circuit board assembly sheet.

The symbols in the Figures show the following.

1: metal sheet, 1A: wiring circuit board forming area, 1B: area for forming a lead wire for electroplating, 2: base insulating layer, 3: wiring pattern, 4: cover insulating layer, 4a: opening for forming a terminal, 5: terminal, 10: partially completed wiring circuit board, 12: first insulating layer, 13: lead wire for electroplating, 14: the second insulating layer, 16: opening

DETAILED DESCRIPTION OF THE INVENTION

The present invention is described in more detail by referring to Figures.

Figure 1A:
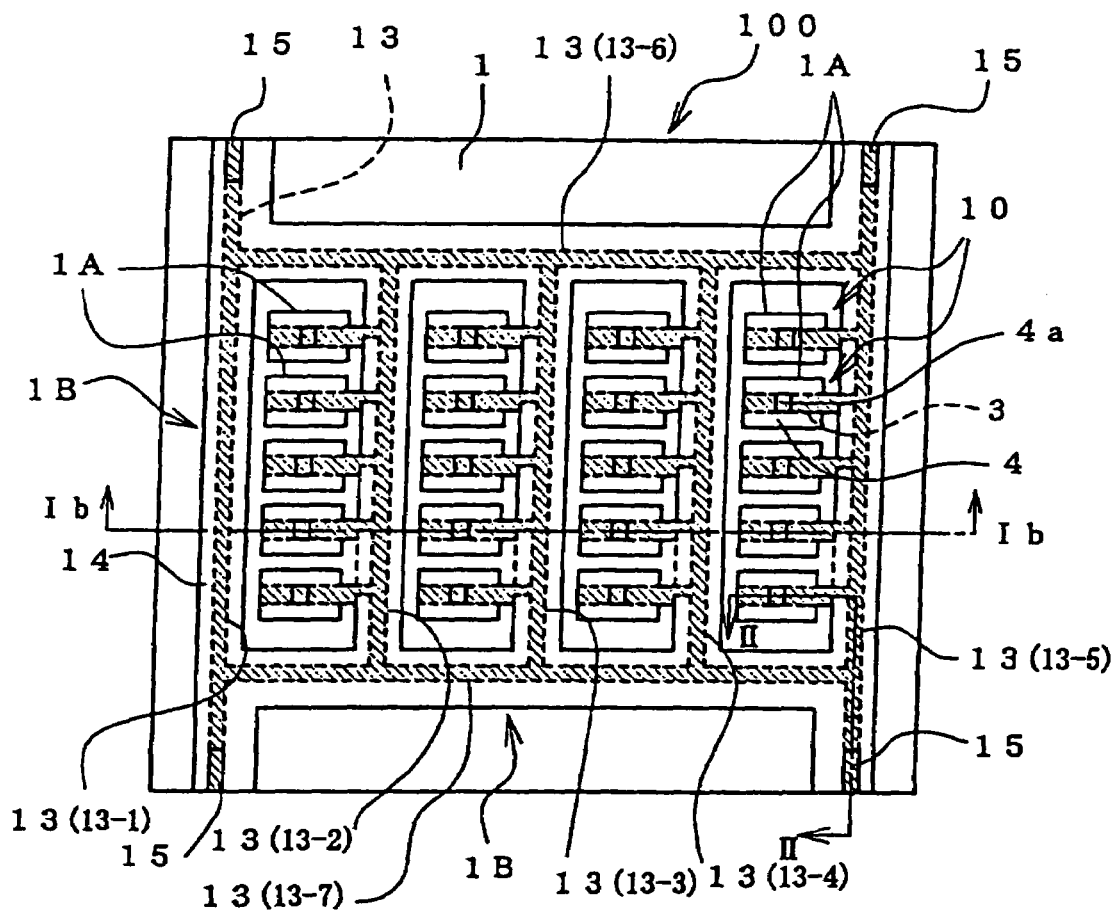
FIG. 1A is a schematic plane view showing one embodiment of the partially completed wiring circuit board assembly sheet of the present invention and FIG. 1B is a sectional view along Ib-Ib in FIG. 1A.
Figure 1B:
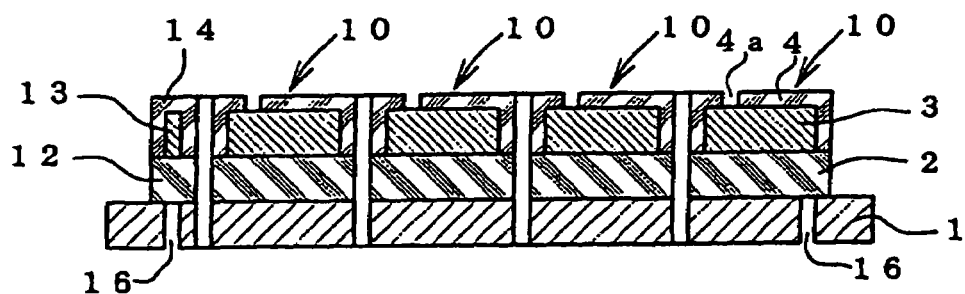

For the sake of convenience of explanation, the wiring pattern 3 and the lead wire 13 for electroplating in FIG. 1A are hatched in the same manner as in the section hatching of the wiring pattern 3 and the lead wire 13 in FIG. 1B.

Figure 3:
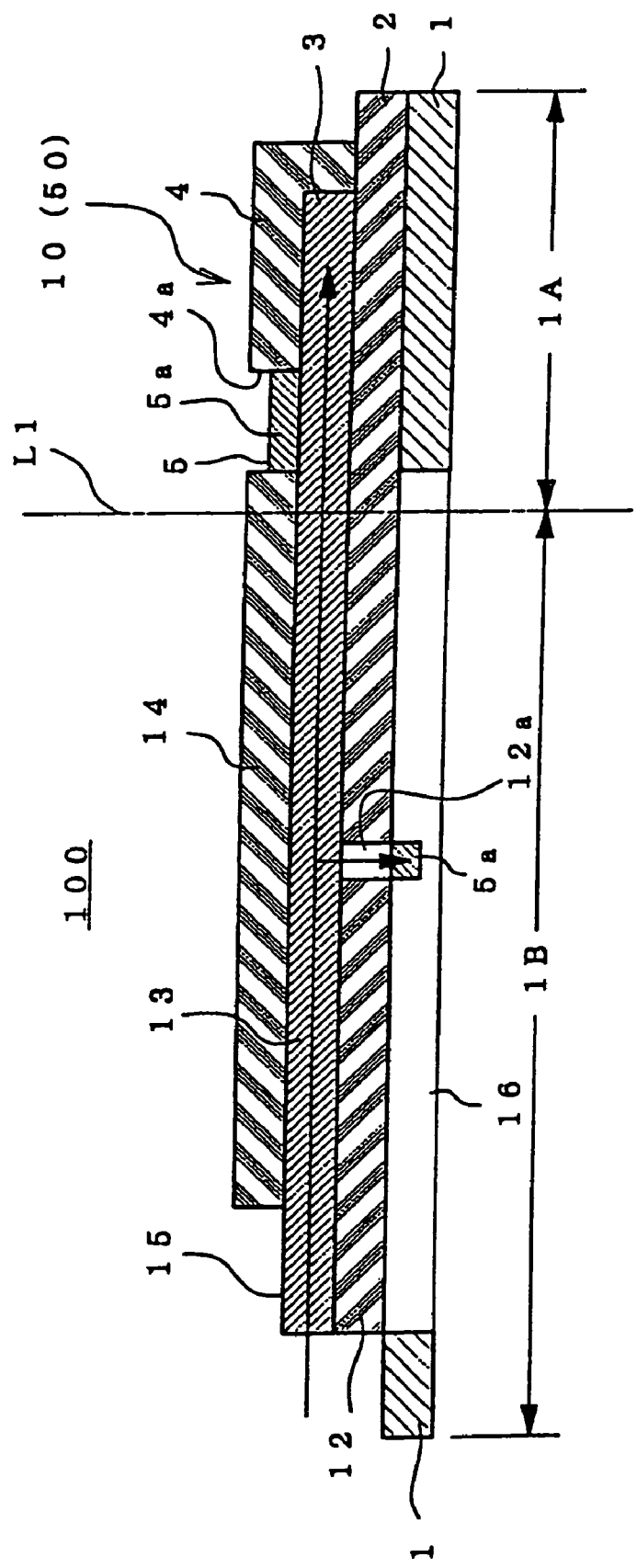
FIG. 3 is a sectional view along II-II in FIG. 1A.

In addition, FIG. 3 shows two sections forming an angle of 90° with each other on a single plane, wherein one side from a dashed line L1 in the Figure as a boundary is a laminate structure formed on the wiring circuit board forming area 1A in the metal sheet 1, and the other side is a laminate structure formed on the area 1B for forming a lead wire for electroplating in the metal sheet 1.

As shown in the one embodiment of the partially completed wiring circuit board assembly sheet 100, the assembly sheet 100 of the present invention has a metal sheet 1, multiple wiring circuit board forming areas 1A placed in compartments in the metal sheet 1 and an area 1B for forming a lead wire for electroplating metal placed in compartments in the sheet 1. Respective wiring circuit board forming areas 1A comprise a partially completed wiring circuit board 10. The partially completed wiring circuit board 10 is formed by sequentially laminating a base insulating layer 2, a wiring pattern 3 and a cover insulating layer 4. An opening 4a for forming a terminal is formed at a given portion of the cover insulating layer 4, and the wiring pattern 3 is exposed at this opening 4a. A first insulating layer 12, a lead wire 13 for electroplating and a second insulating layer 14 are laminated in this order in the area 1B for forming a lead wire for electroplating. The first insulating layer 12 is formed by the same process as for the base insulating layer 2. The lead wire 13 is formed by the same process as for the wiring pattern 3 and is connected to the wiring pattern 3 to supply an electric power to the wiring pattern 3. Furthermore, a part of the lead wire 13 is exposed from the second insulating layer 14 to make a power feeding part 15. In other words, the second insulating layer 14 is not formed on a part (which is the power feeding part 15) of the lead wire 13. The second insulating layer 14 is formed by the same process as for the cover insulating layer 4. In the metal sheet 1, an opening 16 is formed beneath the lead wire 13 for electroplating.

As shown in FIG. 3, according to the present invention, the metal sheet 1 has the opening 16 beneath the lead wire 13 for electroplating. When an undesired pinhole 12a is formed in the insulating layer (first insulating layer 12) to insulate the lead wire 13 from the metal sheet 1, an electric current leaks to a plating solution (not shown) through the pinhole 12a. However, due to the presence of the opening 16, electric current does not easily leak from the lead wire 13 to the metal sheet 1. Thus, an adverse influence exerted by the formation of pinhole 12a is solely the deposition of a plating metal 5a beneath the pinhole 12a caused by the leakage of electric current to the plating solution (not shown) via the pinhole 12a. In this case, since the deposition of the plating metal on the surface of the metal sheet 1 can be prevented, undesired consumption of the electroplating solution can be prevented, and a power is sufficiently supplied to the wiring pattern of each of the multiple partially completed wiring circuit boards 10. As a result, a plating metal 5a is sufficiently deposited in the opening 4a in respective partially completed wiring circuit boards 10. Consequently, a terminal (plated metal layer) 5 having a designed thickness can be formed. In this way, a final product (wiring circuit board 50) comprising a terminal 5 having a given thickness can be certainly obtained and the production yield of the wiring circuit board 50 increases.

Figure 2:
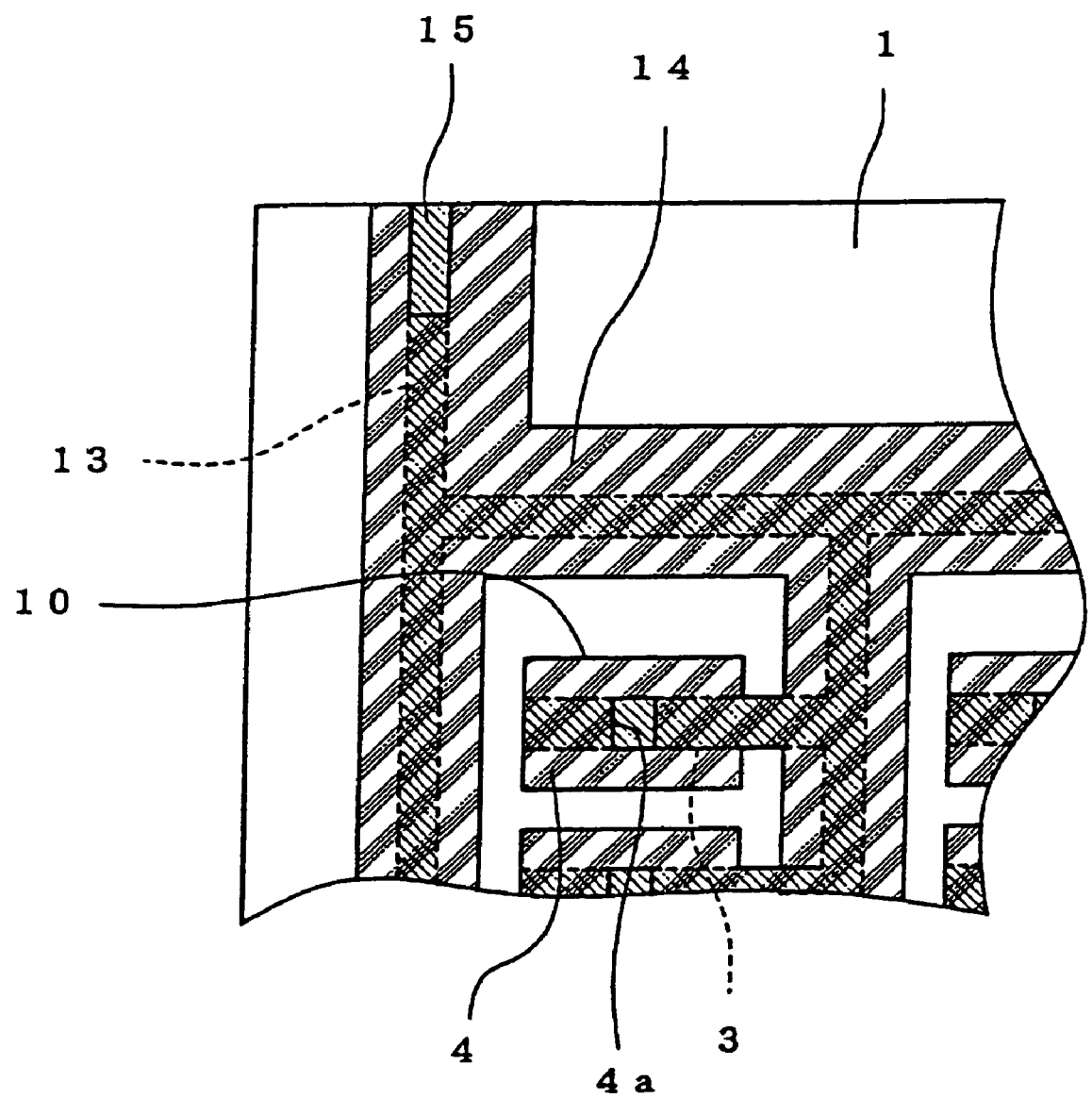
FIG. 2 is an enlarged view of FIG. 1A.
Figure 4A:
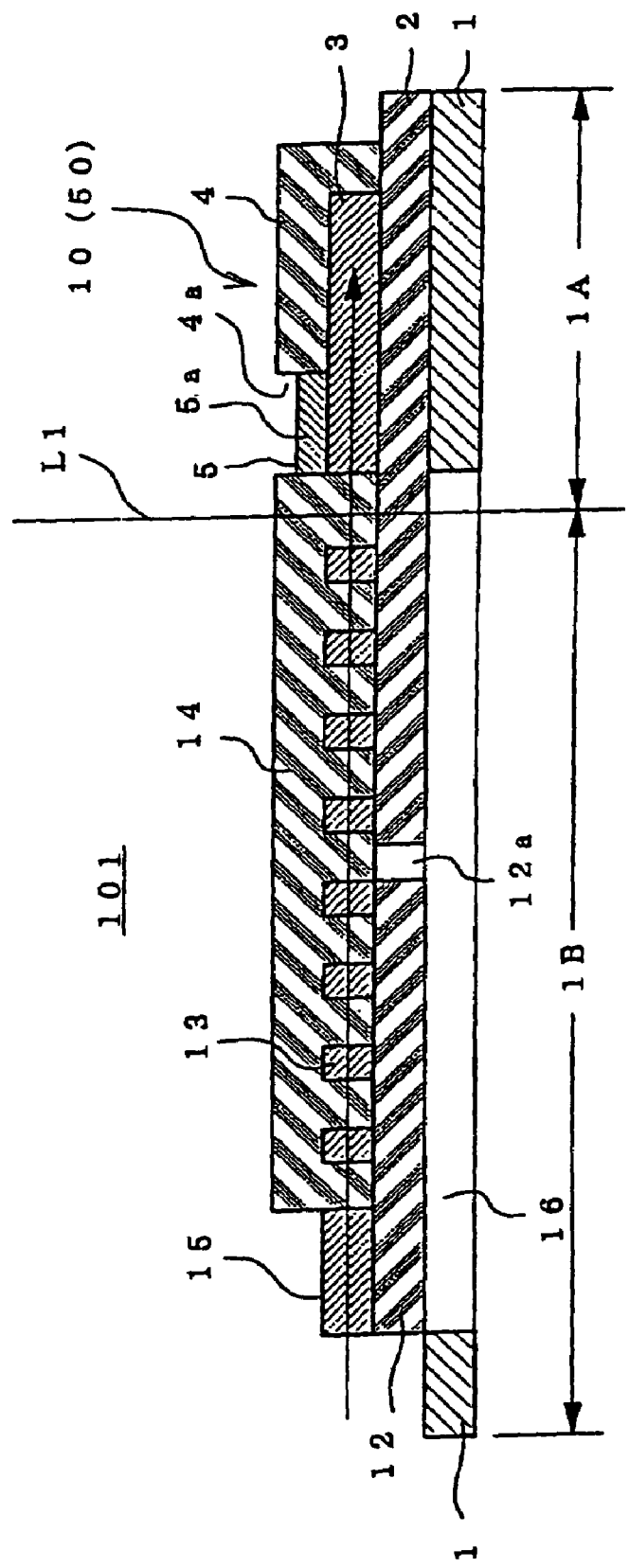
FIG. 4A is a schematic sectional view showing another embodiment of the partially completed wiring circuit board assembly sheet of the present invention.
Figure 4B:
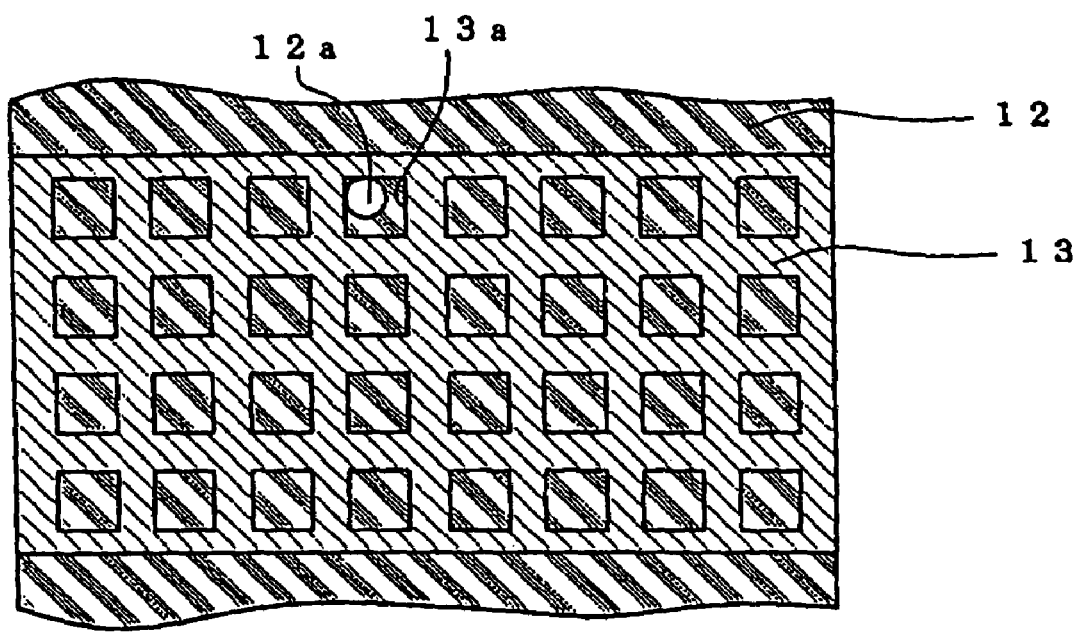
FIG. 4B is a plane view of a lead wire for electroplating in the sheet.
Figure 6:
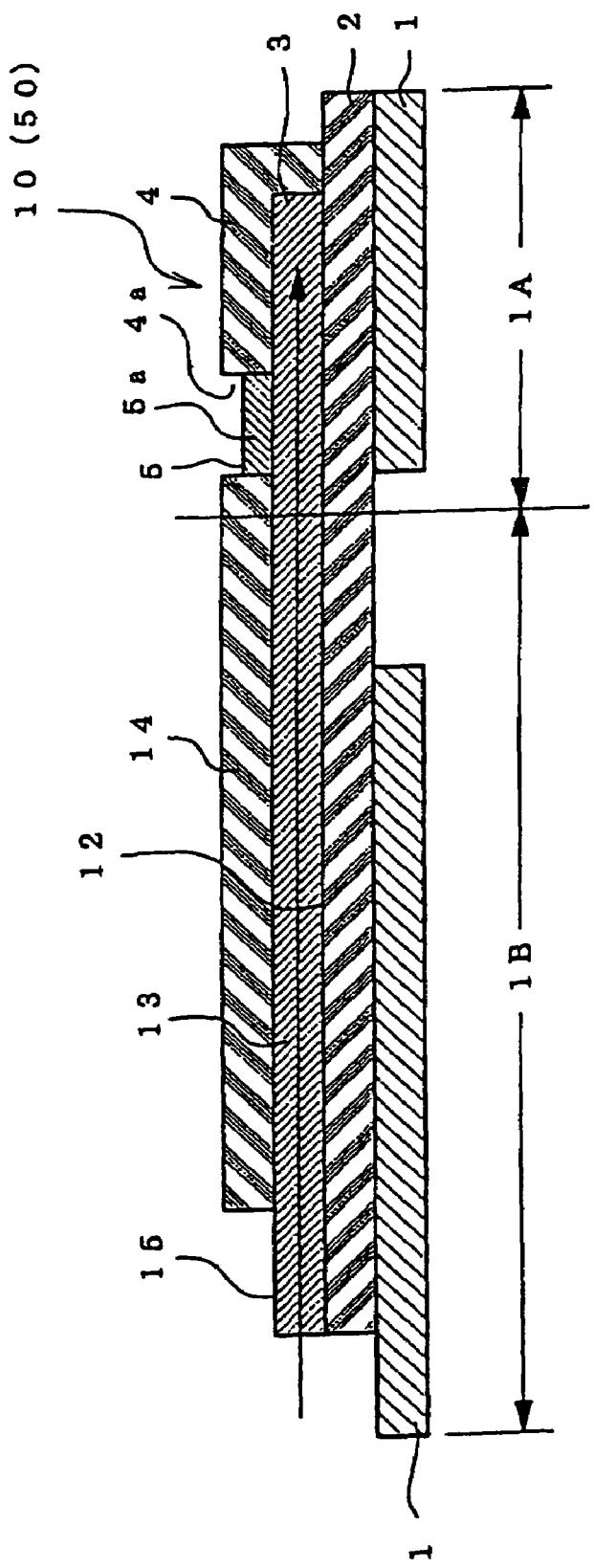
FIG. 6 shows a wiring circuit board obtained by forming a terminal on a partially completed wiring circuit board in the partially completed wiring circuit board assembly sheet of FIG. 5, by an electroplating treatment.
Figure 7:
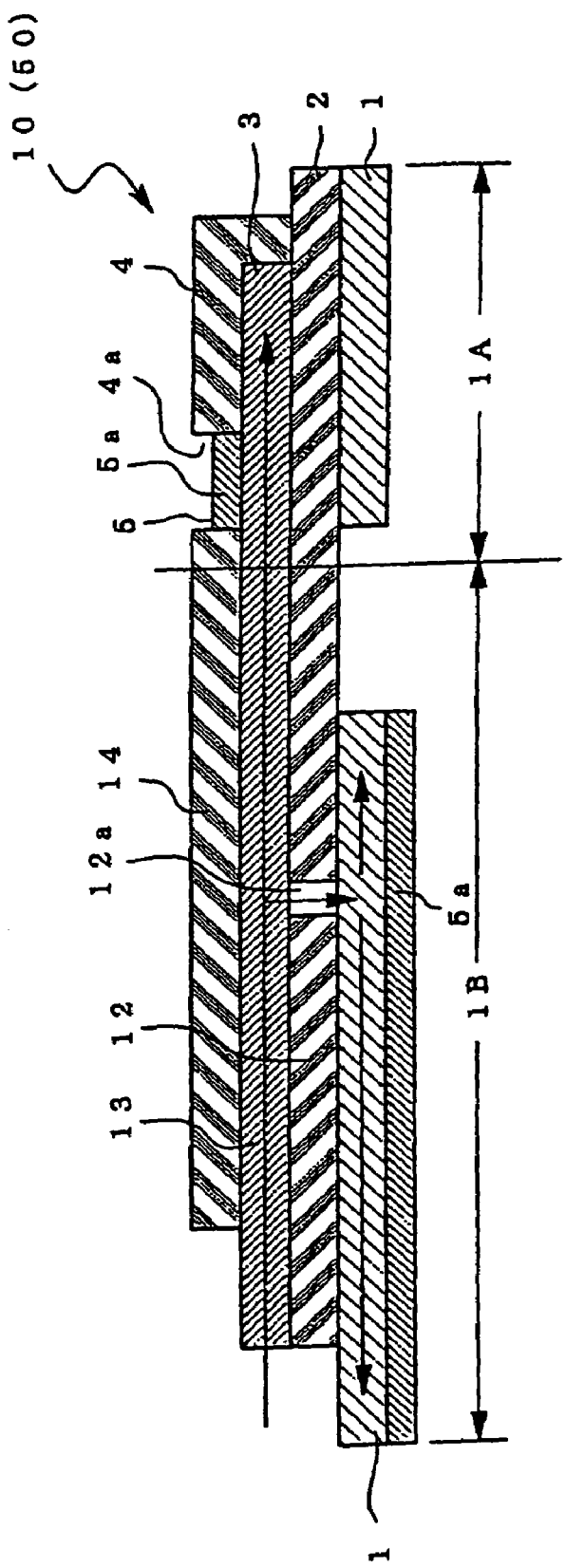
FIG. 7 explains problems associated with conventional partially completed wiring circuit board assembly sheets.

FIG. 4A and FIG. 4B show main parts of another embodiment of the partially completed wiring circuit board assembly sheet of the present invention, wherein FIG. 4A is a sectional view of the part corresponding to FIG. 2 and FIG. 4B is a plane view of a lead wire 13 for electroplating in FIG. 4A. The lead wire 13 in FIG. 4B is hatched in the same manner as in the hatching showing the section of the lead wire 13 in FIG. 4A.

In the partially completed wiring circuit board assembly sheet 101 of this embodiment, an opening 16 is formed under the lead wire 13 in the metal sheet 1 and multiple through holes 13a are formed in the lead wire 13. Even if undesired pinhole 12a is formed in the first insulating layer 12 of the partially completed wiring circuit board assembly sheet 101, as long as the pinhole 12a is disposed under the through hole 13a in the lead wire 13, electric current does not leak to a plating solution from the lead wire 13 via the pinhole 12a. In other words, the consumption of the plating solution can be decreased further, and feeding of power to each wiring pattern 3 on the multiple partially completed wiring circuit boards 10 can be stabilized more. Therefore, by forming multiple through holes 13a in the lead wire 13, a final product (wiring circuit board 50) having a terminal 5 having a given thickness as designed can be produced in a high yield.

The size, number, arrangement and the like of a through hole 13a that may be formed in a lead wire 13 for electroplating are not particularly limited. Preferably, holes having substantially the same size are regularly arranged and the wiring forms a mesh-like pattern. As the shape of the section perpendicular to the axis of the through hole, i.e., shape of hole, circle, square, rectangle and the like can be mentioned. Examples of the multiple holes arrangement preferably include a matrix and a houndtooth pattern. Since delamination of the lead wire 13 due to an outside stress can be prevented, a more preferable embodiment is an arrangement of holes having an about square hole shape in a matrix state, i.e., lattice mesh.

When the through hole 13a is too big, or when the wiring (conductive material) between holes is too small, the impedance of the lead wire 13 may partially differs, or the impedance of the whole wiring may increase to ultimately decrease the efficiency of electroplating. Therefore, in general, the area (area of the section perpendicular to the axis of through hole) of one hole is preferably 10,000-250,000 $\mu m^2$, more preferably 40,000-160,000 $\mu m^2$. For the same reasons, the pitch of the holes is preferably 200-1,000 $\mu m$, more preferably 400-800 $\mu m$.

According to the present invention, the arrangement of the multiple partially completed wiring circuit boards, arrangement of the lead wires for electroplating and the like are not particularly limited. In a preferable embodiment, as shown in FIG. 1, multiple partially completed wiring circuit boards 10 are disposed to form a matrix, one lead wire for electroplating (13-1 ... 13-5) is formed in parallel to each row or each column of the matrix, lead wires for electroplating (13-6, 13-7) to connect both ends of these wirings (13-1 ... 13-5) are further formed, a part of the lead wire 13, which is disposed in the vicinity of partially completed wiring circuit boards 10 on four corners of multiple partially completed wiring circuit boards 10 arranged in a matrix is exposed to form a power feeding part 15. According to such preferable embodiment, a power can be uniformly and efficiency supplied to a wiring patterns 3 of multiple partially completed wiring circuit boards 10 in the sheet, whereby the productivity (production efficiency) of the wiring circuit board can be improved more.

The partially completed wiring circuit board assembly sheet of the present invention can be applied to the production of wiring circuit boards for various uses, and preferable for the production of a suspension substrate with a circuit for mounting a head. This is because a stainless steel foil having repulsion property, high conductivity and corrosion resistance is preferably used as a metal sheet in a suspension substrate with a circuit. As specific examples of the above-mentioned head, a magnetic head in the hard disc drive can be mentioned, and particularly, thin film magnetic head (TFH) wherein a coil is a thin film, a thin film—magnetoresistant composite head (MR) and the like can be mentioned.

According to the present invention, the material of the metal sheet 1 is not particularly limited. For example, when the wiring circuit board is a suspension substrate with circuit, stainless steel (SUS304), 42 alloy and the like are preferably used as the metal sheet 1. In addition, the thickness of the metal sheet can be appropriately determined depending on the use of the wiring circuit board to be produced, and when a suspension substrate with circuit is to be produced, it is preferably 10-60 $\mu m$, more preferably 15-30 $\mu m$.

As the base insulating layer 2 and the first insulating layer 12, known insulating materials used for base insulating layers of wiring circuit boards can be used. For example, when the wiring circuit board is a suspension substrate with circuit, polyimide resins can be preferably mentioned from the aspect of heat resistance and the like, and photosensitive polyimide resins can be particularly preferably mentioned from the aspect of easy processability. The thickness of the base insulating layer 2 and the first insulating layer 12 can be appropriately determined depending on the use of the wiring circuit board and the like. For example, when the wiring circuit board is a suspension substrate with circuit, the thickness is preferably 2-20 $\mu m$, more preferably 5-15 $\mu m$.

As the wiring pattern 3 and the lead wire 13, known conductive materials used as wiring of wiring circuit boards can be used. For example, when the wiring circuit board is a suspension substrate with circuit, copper, copper-beryllium, phosphor bronze, 42 alloy and the like are preferable, and copper is particularly preferable, from the electric properties.

The wiring pattern 3 and the lead wire 13 can be formed by a known method. When a wiring is formed from a copper-containing material, a metal thin film that strongly adheres to the base insulating layer and the first insulating layer are formed, and elements having the same composition as the wiring are continuously laminated to facilitate formation of wiring with a copper-containing material. To be specific, a Cr/Cu thin film is first formed by sputtering, copper-containing material layer having a predetermined pattern is preferably formed by semiadditive plating with the Cr/Cu thin film as a base layer.

The thickness of the wiring pattern 3 and the lead wire 13 is not particularly limited. For example, when the wiring circuit board is a suspension substrate with circuit, the thickness is preferably 5-20 $\mu m$, more preferably 10-15 $\mu m$. The width of the wiring pattern 3 (width in the direction perpendicular to the axis of pattern) can be appropriately determined depending on the use of wiring circuit board and the like. For example, when the wiring circuit board is a suspension substrate with circuit, the width is preferably 10-500 $\mu m$, more preferably 30-200 $\mu m$. The width of the lead wire 13 (width in the direction perpendicular to the axis of pattern) may be different depending on whether a through hole is formed in the wiring 13. The width is generally 100-500 $\mu m$, preferably 200-400 $\mu m$.

For the cover insulating layer 4 and the second insulating layer 14, known insulating materials used as cover insulating layers to protect a wiring pattern of wiring circuit boards can be used. For example, when the wiring circuit board is a suspension substrate with circuit, polyimide resins are preferably used from the aspects of heat resistance and the like, and photosensitive polyimide resins are particularly preferably used from the aspects of easy processability. The thickness of the cover insulating layer 4 and the second insulating layer 14 is not particularly limited. For example, when the wiring circuit board is a suspension substrate with circuit, the thickness is preferably 1-10 μm, more preferably 3-7 μm. The opening 4a for forming a terminal is generally square or rectangle, and the area thereof is about 0.01-1.0 mm². A part of the lead wire 13 for electroplating is not covered with the second insulating layer 14 but exposed to become a power feeding part 15. The shape of the power feeding part 15 is generally square or rectangle, and the area thereof is about 10-50 mm².

According to the present invention, as a terminal (electroplated layer) 5 to be formed in the opening 4a, Ni layer, Au layer, Ni/Au layer and the like can be mentioned. The thickness of the terminal is preferably about 1-5 μm.

The production method of the partially completed wiring circuit board assembly sheet of the present invention is not particularly limited, and known production techniques for wiring circuit boards may be employed. For example, when the wiring circuit board is a suspension substrate with circuit, the following methods (only examples) are preferable.

First, a precursor solution of photosensitive polyimide is applied to a stainless steel (SUS 304) foil, dried by heating to form a film, which is successively subjected to pattern exposure, heating and development treatment to form a base insulating layer and a first insulating layer, which are made from a patterned polyimide resin films.

Then, a chrome thin film and a copper thin film are successively formed on the thus-formed base insulating layer and first insulating film by a continuous sputtering treatment to give a base layer having a surface resistance of about 0.3-0.4 Ω/□.

Then, a dry film laminate (resist) is heated and laminated on the base layer, which is followed by exposure and development. Copper sulfate electroplating of the non-pattern part results in the formation of a conductive layer made of the copper plating. Thereafter the resist is removed.

The stainless steel (SUS304) foil after the above-mentioned treatments is immersed in a mixed aqueous solution (e.g., 25° C.) of potassium ferricyanide and potassium hydroxide to remove unnecessary chrome thin film mentioned above. Further, the foil is immersed in a nitric acid release agent (e.g., a mixed aqueous solution of hydrogen peroxide and nitric acid at 25° C.) to remove the aforementioned copper foil film, whereby a wiring pattern is obtained. Thereafter, a conventional electroless plating is applied to form an about 0.1 μm thick nickel thin film on the copper conductive layer (wiring pattern and lead wire for electroplating).

Then, coating layers (cover insulating layer and the second insulating layer) are formed using a photosensitive polyimide (precursor solution) similar to the one mentioned above, on the wiring pattern and the lead wire for electroplating on the stainless steel (SUS304) foil. At this point, an opening for forming a terminal is made in the cover insulating layer and an opening for exposing a power feeding part of the lead wire for electroplating is made in the second insulating layer.

The surface of the side free of the insulating layers (base insulating layer and first insulating layer) except the part under the lead wire for electroplating of the stainless steel (SUS304) foil is covered with a resist. The foil is etched with an aqueous ferric chloride solution to remove the part under the lead wire for electroplating on the foil.

The part of the insulating layers (base insulating layer and first insulating layer), which is exposed as a result of the removal of the foil, is removed with an aqueous alkaline (e.g., ethanolamine) solution. The resist is removed and the chrome thin film and the nickel thin film are successively removed.

A dry film laminate (resist) is laminated by heating, exposed and developed to form an opening in the resist according to the outer shape, and the stainless steel (SUS304) foil is etched and the resist is removed. Then, nickel electroplating and gold electroplating are successively applied to form a nickel plating layer (about 1 μm thick) and a gold plating layer (about 2 μm thick) at predetermined positions.

In this way, a partially completed wiring circuit board assembly sheet can be obtained. This assembly sheet has a stainless steel (SUS304) foil and multiple wiring circuit board forming areas and lead wire forming areas for electroplating, which are placed in compartments on the foil. The respective wiring circuit board forming areas comprise a partially completed wiring circuit board of a suspension substrate with circuit. The lead wire formed in the lead forming area is connected to the above-mentioned wiring pattern. Here, the partially completed wiring circuit board means a semi-product with uncompleted terminals.

When the partially completed wiring circuit board assembly sheet of the present invention is immersed in a plating solution, a plating apparatus is generally equipped with a plating solution housing part containing a plating solution, a sheet conveyor means and a power feeding means. The partially completed wiring circuit board assembly sheet is transported by the sheet conveyor means while being immersed in the plating solution in the plating solution housing part. The power feeding means feeds power upon contact with the power feeding part exposed in the lead wire for electroplating of the assembly sheet. The electroplating treatment is performed by feeding a power from a power feeding means to the power feeding part of the lead wire while immersing the sheet in the plating solution. By the electroplating treatment, an electroplated layer is deposited in the opening in the cover insulating layer of each partially completed wiring circuit board. The electroplated layer is used as a terminal of a wiring circuit board. Such electroplating treatment can be performed for every assembly sheet. It is also possible to treat multiple assembly sheets by successively transporting them into a plating solution housing part by a conveyor means.

For example, as described in JP-A-2002-20898, the power feeding means is preferably equipped with a chuck mechanism connected with a power feeding wiring, and a mechanism to move the chuck mechanism in synchronization with the transport of the assembly sheet. The chuck mechanism can pinch a power feeding part of the lead wire for electroplating on the assembly sheet.

The assembly sheet of the present invention is electroplated to form a terminal for each of the multiple partially completed wiring circuit boards present in the assembly sheet. As a result, multiple wiring circuit boards are prepared at once.

EXAMPLES

The present invention is explained in more detail in the following by referring to Examples and Comparative Examples, which are not to be construed as limitative.

Example 1

Using a stainless steel (SUS304) foil (length 300 mm, width 300 mm, thickness 20 μm), a partially completed wiring circuit board assembly sheet for a suspension substrate with circuit, as shown in FIGS. 1-3, was prepared according to the aforementioned production method.

The area occupied by one partially completed wiring circuit board is 45 mm$^2$. Partially completed wiring circuit boards (420, 84 rows×5 columns) were produced. The base insulating layer (first insulating layer) was 10 μm thick, a wiring pattern and a lead wire for electroplating, both made of a copper layer, were 15 μm thick, the width of the wiring pattern was 30-50 μm, the width of the lead wire for electroplating was 5 mm, a cover insulating layer (the second insulating layer) was 5 μm thick, the area of an opening for forming a terminal was 0.04 mm$^2$, and an area of 25 mm$^2$ of the lead wire was exposed to form a power feeding part.

The assembly sheet thus obtained was subjected to electroplating treatment in a gold cyanide plating solution by applying a power of 69 mA for 800 sec to form a terminal. While the first insulating layer of the sheet had a few pinholes, the electric current did not leak to the stainless steel (SUS304) foil. The thickness of the electroplated layer (terminal) was within the designed range (2±0.6 μm). In other words, while the plating metal was deposited in pinholes, the thickness of the terminals formed in each of the partially completed wiring circuit boards (84 rows×5 columns (total 420)) were all within the range of 2±0.2 μm and the circuit boards had good quality.

Example 2

Using the same stainless steel foil as in Example 1, a partially completed wiring circuit board assembly sheet for a suspension substrate with circuit, as shown in FIG. 4, was prepared according to the aforementioned production method. The width of the lead wire for electroplating was set for 5 mm. A lattice pattern was obtained by forming through holes having a shape of a square hole (one side 300 μm) in a matrix at a pitch of 600 μm on the lead wire. Besides this, the assembly sheet comprising partially completed wiring circuit boards in the same number (84 rows×5 columns) as in Example 1 was prepared in the same manner as in Example 1.

This assembly sheet was subjected to an electroplating treatment under the same plating conditions as in Example 1 to form terminals. While the first insulating layer of the sheet had a few pinholes, the electric current did not leak to the stainless steel (SUS304) foil. The thickness of the electroplated layer (terminal) was within the designed range (2±0.6 μm). In other words, the thickness of the terminals formed in each of the partially completed wiring circuit boards (84 rows×5 columns (total 420)) were all within the range of 2±0.1 μm and the circuit boards had good quality. In addition, deposition of the plating metal in the pinholes was not observed.

Comparative Example 1

Using the same stainless steel foil as in Example 1, a partially completed wiring circuit board assembly sheet comprising the same number (84 rows×5 columns) as in Example 1 of partially completed wiring circuit boards was prepared in the same manner as in Example 1. However, the step of forming an opening under the lead wire for electroplating in the stainless steel foil was not performed.

This assembly sheet was subjected to an electroplating treatment under the same plating conditions as in Example 1 to form terminals. Presumably due to the few pinholes formed in the first insulating layer, the electric current leaked to the stainless steel foil. As a result, a plated metal layer was also formed on the surface opposite to the surface where the base insulating layer (first insulating layer) of stainless steel foil was formed. The thickness of the terminals formed in each of the partially completed wiring circuit boards (84 rows×5 columns (total 420)) failed to reach the designed range (2±0.6 μm).

INDUSTRIAL APPLICABILITY

According to the present invention, even when a pinhole is produced in an insulating layer for insulating a lead wire from a metal sheet, electric current leakage from the pinhole to the metal sheet can be prevented in the electroplating treatment for forming terminals in respective partially completed wiring circuit boards. As a result, deposition of a plating metal on the surface opposite to the surface where an insulating layer is formed in a metal sheet can be prevented. Consequently, undesired consumption of a plating solution in an electroplating treatment can be suppressed, and terminals (plated metal layers) formed on each of the multiple partially completed wiring circuit boards can be certainly made to have a thickness within the designed range, which in turn improves the production yield of wiring circuit boards.

This application is based on patent application No. 2004-229363 filed in Japan, the contents of which are hereby incorporated by reference.

The invention claimed is:

1. A partially completed wiring circuit board assembly sheet equipped with the following (A) to (C);
  (A) a metal sheet,
  (B) multiple wiring circuit board forming areas in compartments on the metal sheet,
    each of which comprises a partially completed wiring circuit board comprising a base insulating layer, a wiring pattern and a cover insulating layer laminated in this order, and an opening for forming a terminal at a given part of the cover insulating layer, and
  (C) an area for forming a lead wire for electroplating, which is in a compartment in the metal sheet,
    which comprises a first insulating layer, a lead wire for electroplating and a second insulating layer laminated in this order, wherein
    the first insulating layer is formed by the same process as for the base insulating layer,
    the lead wire for electroplating
    has multiple through holes,
    is formed by the same process as for the wiring pattern, and
    is connected to multiple wiring patterns on the multiple wiring circuit board forming areas (B) so as to provide a power to the multiple wiring patterns, and
    a part thereof is exposed to form a power feeding part,
    the second insulating layer is formed by the same process as for the cover insulating layer, and
  wherein an opening is formed on the metal sheet (A) beneath the lead wire for electroplating.

2. The assembly sheet of claim 1, wherein the wiring circuit board is a suspension substrate with a circuit.

3. A method of producing multiple wiring circuit boards at once, which comprises the steps of immersing the assembly sheet of claim 1 in a plating solution, and feeding a power to the wiring pattern in each partially completed wiring circuit board via the lead wire for electroplating in the aforementioned sheet, thereby forming an electroplated layer in the opening formed on the metal sheet (A) for forming a terminal in each partially completed wiring circuit board.

* * * * *